(12) United States Patent
Geng

(10) Patent No.: US 12,205,836 B2
(45) Date of Patent: Jan. 21, 2025

(54) TEMPERATURE CHANGE RATE CONTROL DEVICE, METHOD, AND SEMICONDUCTOR PROCESS APPARATUS

(71) Applicant: BEIJING NAURA MICROELECTRONICS EQUIPMENT CO., LTD., Beijing (CN)

(72) Inventor: Hongwei Geng, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 55 days.

(21) Appl. No.: 18/191,707

(22) Filed: Mar. 28, 2023

(65) Prior Publication Data

US 2023/0238261 A1 Jul. 27, 2023

Related U.S. Application Data

(63) Continuation of application No. PCT/CN2021/121583, filed on Sep. 29, 2021.

(30) Foreign Application Priority Data

Sep. 29, 2020 (CN) .......................... 202011055119.0

(51) Int. Cl.
*H01L 21/67* (2006.01)
(52) U.S. Cl.
CPC .. *H01L 21/67248* (2013.01); *H01L 21/67017* (2013.01)
(58) Field of Classification Search
CPC ......... H01L 21/67248; H01L 21/67017; H01L 21/67109; H01L 21/67253;
(Continued)

(56) References Cited

U.S. PATENT DOCUMENTS 8,288,288 B1 10/2012 Gage et al.
2017/0194163 A1 7/2017 Cosceev et al.
(Continued)

FOREIGN PATENT DOCUMENTS

CN 1212363 A 3/1999
CN 1450008 A 10/2003
(Continued)

OTHER PUBLICATIONS

The World Intellectual Property Organization (WIPO) International Search Report for PCT/CN2021/121583 Dec. 31, 2021 6 Pages (including translation).
(Continued)

*Primary Examiner* — Dale E Page
*Assistant Examiner* — Quovaunda Jefferson
(74) *Attorney, Agent, or Firm* — ANOVA LAW GROUP, PLLC

(57) ABSTRACT

Embodiments of the present disclosure provide a temperature change rate control device, applied to a process chamber of a semiconductor process apparatus, including a temperature monitor unit, a controller, a gas inflation mechanism, and a gas extraction mechanism. The temperature monitor unit is configured to obtain a temperature of a wafer in the process chamber in real time. The controller is configured to calculate a temperature change rate of the wafer according to the temperature obtained by the temperature monitor unit. The gas inflation mechanism communicates with the process chamber. The gas extraction mechanism communicates with the process chamber. When the temperature change rate is outside a predetermined temperature change rate range, a first control signal is sent to the gas inflation mechanism, and/or a second control signal is sent to the gas extraction mechanism to control the temperature change rate within the temperature change rate range.

10 Claims, 4 Drawing Sheets

(58) Field of Classification Search
CPC ......... H01L 21/67011; H01L 21/68785; Y02P 70/50; C23C 14/541
See application file for complete search history.

(56) References Cited

U.S. PATENT DOCUMENTS

2018/0354065 A1* 12/2018 Kobayashi ............. B23K 20/02
2023/0095537 A1*  3/2023 Takahashi ........... C23C 16/4412
                                                          118/715

FOREIGN PATENT DOCUMENTS

| | | | |
|---|---|---|---|
| CN | 105892243 | A | 8/2016 |
| CN | 110854010 | A | 2/2020 |
| CN | 111199897 | A | 5/2020 |
| CN | 112289708 | A | 1/2021 |
| JP | H01102904 | A | 4/1989 |
| JP | 2004128390 | A | 4/2004 |
| JP | 2009182235 | A | 8/2009 |
| JP | 2012199397 | A | 10/2012 |
| JP | 2016039299 | A | 3/2016 |
| JP | 2018053298 | A | 4/2018 |
| KR | 20190115664 | A | 10/2019 |

OTHER PUBLICATIONS

The European Patent Office (EPO) The Extended European Search Report for Application No. 21874508.1 Oct. 31, 2024 6 Pages.

* cited by examiner

TEMPERATURE CHANGE RATE CONTROL DEVICE, METHOD, AND SEMICONDUCTOR PROCESS APPARATUS

CROSS-REFERENCE TO RELATED APPLICATIONS

This application is a continuation of International Application No. PCT/CN2021/121583, filed on Sep. 29, 2021, which claims priority to Chinese Application No. 202011055119.0 filed on Sep. 29, 2020, the entire contents of all of which are incorporated herein by references.

TECHNICAL FIELD

The present disclosure generally relates to the integrated circuit manufacturing technology field and, more particularly, to a temperature change rate control device, a temperature change rate control method, and a semiconductor process apparatus.

BACKGROUND

With increasingly higher requirements of the technology generation for 28 nm and below being imposed on particle size and a particle number, the impact of particles generated during a wafer process on the process result is becoming more and more obvious. This makes the reduction of the particle number very critical in the process. Since sizes of trenches and line widths in an integrated circuit are small, even a tiny particle can cause great damage to a wafer process result, for example, conduction of different wires, disconnection of a same wire, and formation of a hole to cause greater energy consumption and heat generation. Manufacturing a chip unit on the wafer with these problems can result in the chip unit being unusable and scrapped, resulting in lower product yield.

SUMMARY

Embodiments of the present disclosure provide a temperature change rate control device, applied to a process chamber of a semiconductor process apparatus, including a temperature monitor unit, a controller, a gas inflation mechanism, and a gas extraction mechanism. The temperature monitor unit is configured to obtain a temperature of a wafer in the process chamber in real time. The controller is configured to calculate a temperature change rate of the wafer according to the temperature obtained by the temperature monitor unit. The gas inflation mechanism communicates with the process chamber. The gas extraction mechanism communicates with the process chamber. In response to the temperature change rate being outside a predetermined temperature change rate range, a first control signal is sent to the gas inflation mechanism, and/or a second control signal is sent to the gas extraction mechanism to control the temperature change rate within the temperature change rate range. The gas inflation mechanism is configured to introduce a gas that does not react with the wafer into the process chamber according to the received first control signal to control the temperature change rate of the wafer by adjusting a pressure of the process chamber. The gas extraction mechanism is configured to extract the gas of the process chamber according to the received second control signal to control the temperature change rate of the wafer by adjusting the pressure of the process chamber.

Embodiments of the present disclosure provide a semiconductor process apparatus, including a process chamber and a temperature change rate control device. The temperature change rate control device includes a temperature monitor unit, a controller, a gas inflation mechanism, and a gas extraction mechanism. The temperature monitor unit is configured to obtain a temperature of a wafer in the process chamber in real time. The controller is configured to calculate a temperature change rate of the wafer according to the temperature obtained by the temperature monitor unit. The gas inflation mechanism communicates with the process chamber. The gas extraction mechanism communicates with the process chamber. In response to the temperature change rate being outside a predetermined temperature change rate range, a first control signal is sent to the gas inflation mechanism, and/or a second control signal is sent to the gas extraction mechanism to control the temperature change rate within the temperature change rate range. The gas inflation mechanism is configured to introduce a gas that does not react with the wafer into the process chamber according to the received first control signal to control the temperature change rate of the wafer by adjusting a pressure of the process chamber. The gas extraction mechanism is configured to extract the gas of the process chamber according to the received second control signal to control the temperature change rate of the wafer by adjusting the pressure of the process chamber.

Embodiments of the present disclosure provide a temperature change rate control method that is applied to a process chamber of a semiconductor process apparatus using a temperature change rate control device. The method includes obtaining a temperature of a wafer in the process chamber in real time, calculating a temperature change rate of the wafer according to the temperature, and determining whether the temperature change rate of the wafer is within a predetermined temperature change rate range. In response to the temperature change rate of the wafer being not within the predetermined temperature change rate range, the method includes sending a first control signal to a gas inflation mechanism, and/or sending a second control signal to a gas extraction mechanism to control the temperature change rate of the wafer. The gas inflation mechanism is configured to introduce a gas that does not react with the wafer into the process chamber according to the received first control signal to control the temperature change rate of the wafer by adjusting a pressure of the process chamber. The gas extraction mechanism is configured to extract the gas of the process chamber according to the received second control signal to control the temperature change rate of the wafer by adjusting the pressure of the process chamber. The method further includes returning to obtaining the temperature of the wafer in the process chamber in real time, and in response to the temperature change rate of the wafer being within the predetermined temperature change rate range, returning to obtaining the temperature of the wafer in the process chamber in real time.

The beneficial effects of the present disclosure are as follows.

In the technical solution of the temperature change rate control device, method, and semiconductor process apparatus of the present disclosure, the temperature of the wafer located in the process chamber can be obtained in real-time through the temperature monitor unit. The temperature change rate of the wafer is calculated by the controller. If the temperature change rate is outside the predetermined temperature change rate range, the first control signal is sent to the gas inflation mechanism, and/or the second control signal is sent to the gas extraction mechanism. The gas inflation mechanism can be configured to introduce the gas that does not react with the wafer into the process chamber according to the received first control signal. The gas extraction mechanism can be configured to extract the gas from the process chamber according to the received second control signal. Thus, the pressure of the process chamber can be adjusted to indirectly adjust the heat transfer between the wafer and the heat source or cold source to control the temperature change rate of the wafer until the temperature change rate is located within the temperature change rate range. Thus, the temperature change rate of the wafer can be accurately controlled, the temperature adjustment efficiency of the process chamber can be effectively improved. Meanwhile, the problem of the particle contamination due to the wafer being cooled too fast can be avoided.

The device of the present disclosure has other features and advantages. These features and advantages are obvious from the accompanying drawings and embodiments described in the specification or will be described in detail in the accompanying drawings and embodiments incorporated in the specification. These accompanying drawings and embodiments are used together to describe the specific principle of the present disclosure.

BRIEF DESCRIPTION OF THE DRAWINGS

Embodiments of the present disclosure are described in more detail in connection with the accompanying drawings. The above and other purposes, features, and advantages of the present disclosure will become more apparent. In embodiments of the present disclosure, a same reference numeral can usually represent a same member.

Figure 1:
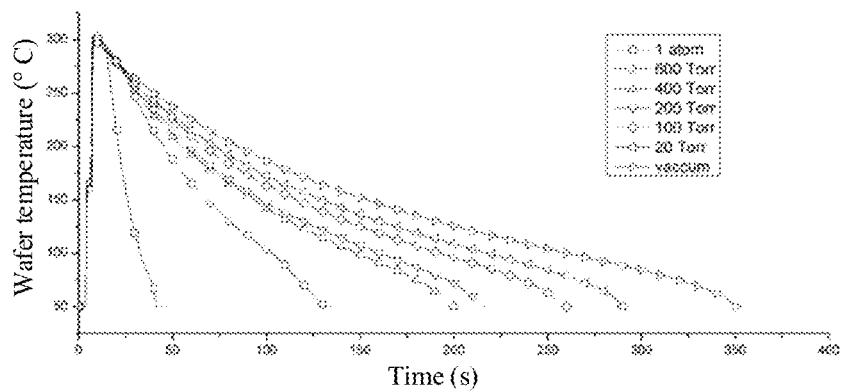
FIG. 1 illustrates a schematic curve diagram showing temperature decrease of a wafer with different gases.

| Reference numeral: |
| --- |
| 101 Process chamber |
| 102 Cold plate |
| 103 Bracket |
| 104 Wafer |
| 105 Dielectric window |
| 106 Gas inflation valve |
| 107 Gas extraction valve |
| 108 Temperature probe |
| 109 Thermometer |
| 110 Controller |

DETAILED DESCRIPTION OF THE EMBODIMENTS

The technology generation below 28 nm, especially the technology generation below 14 nm-7 nm, has requirements for particles mainly in the following two aspects. On one hand, the particle size is required to be smaller, even below 10 nm. On another hand, the number of particles is required to be less, usually required to be stable below 10.

Moreover, in addition to strictly controlling the particles generated during the process, the particles generated during the transfer of wafers outside the process chamber also need special attention. Taking a typical physical vapor deposition process as an example, wafers need to be cooled in an inert gas environment after the process is completed before being released into the atmosphere.

The following cooling process can be performed on a processed wafer:
1. transferring the wafer into a process chamber and onto a bracket;
2. the wafer falling onto a cold plate with the bracket;
3. turning on a gas inflation valve to introduce an inert gas (e.g., Ar) into the process chamber, and turning off the gas inflation valve after a predetermined time length (e.g., 10 s) to cause an air pressure in the process chamber to reach the predetermined air pressure;
4. cooling the wafer for a certain period of time under the above-predetermined air pressure; and
5. turning on the gas extraction valve until the process chamber is in an atmosphere pressure state and then transferring the wafer out of the process chamber.

In the current cooling process, the real-time temperature of the wafer cannot be monitored. Thus, the temperature cooling rate of the wafer cannot be obtained, and the temperature cooling rate of the wafer cannot be controlled. After the process is cooled in the above cooling process in the process chamber. A problem of excessive particles can occur, which cannot meet the requirements for particles of the technology generation below 14 nm-7 nm.

As shown in FIG. 1, as a pressure of the process chamber increases from vacuum to the atmosphere pressure, the cooling rate of the wafer (e.g., a wafer) gradually becomes faster, and the cooling rate increases from ~1° C./s to ~10° C./s. Since the higher the pressure in the chamber is, the easier the heat of the wafer can be transferred to a cold plate to cause the wafer to be cooled faster. In the processing process, when the cooling rate of the wafer is too fast (~10° C./s), a particle test can seriously exceed a standard (more than 100 particles with a diameter of 10 nm and distributed irregularly). After the pressure of the process chamber is controlled at 100 Torr, the cooling rate becomes slower. Then, the particle test is passed (less than 10 particles with a diameter of 10 nm).

If the cooling rate is too fast, a property of a deposited film can change, such as a particle problem. However, the cooling rate cannot be too slow, otherwise, productivity of a machine can be reduced. Therefore, it is very critical to control the temperature change rate of the wafer.

With the temperature change rate control device, method, and semiconductor process apparatus of the present disclosure, the temperature change rate of the wafer can be monitored and controlled to effectively reduce a particle contamination problem due to that the cooling rate of the wafer is too fast and improve the productivity of the machine.

The present disclosure is described in more detail below with reference to the accompanying drawings. Although preferred embodiments of the present disclosure are shown in the accompanying drawings, it should be understood that the present disclosure can be implemented in various forms and should not be limited to the embodiments described here. On the contrary, these embodiments are provided to cause the present disclosure to be more thorough and complete and fully convey the scope of the present disclosure to those skilled in the art.

Figure 2:
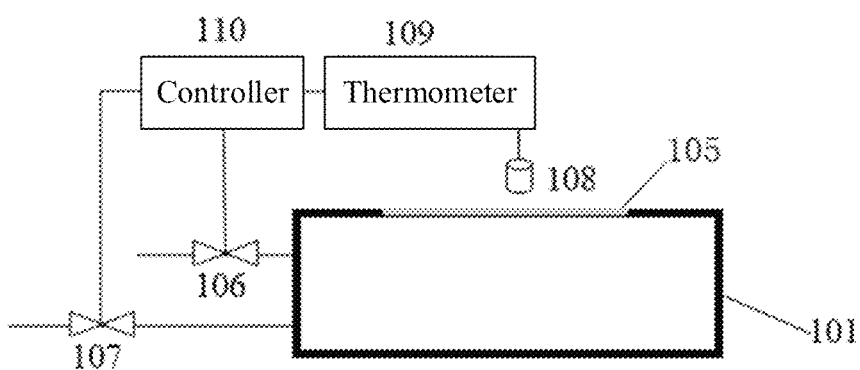
FIG. 2 illustrates a schematic structural diagram of a temperature change rate control device according to some embodiments of the present disclosure.

FIG. 2 illustrates a schematic structural diagram of a temperature change rate control device according to some embodiments of the present disclosure. As shown in FIG. 2, embodiments of the present disclosure provide the temperature change rate control device, which is applied to a process chamber of a semiconductor process apparatus. The device includes a temperature monitor unit, a controller 110 connected to the temperature monitor unit, and a gas inflation mechanism and a gas extraction mechanism connected to the controller 110.

The temperature monitor unit can be configured to obtain the temperature of the wafer in the process chamber 101 in real time. In some embodiments, the temperature monitor unit can include a non-contact temperature measurement element arranged outside the process chamber 101. The non-contact temperature measurement element can be arranged at a position corresponding to a dielectric window 105 (e.g., a transparent quartz window) located at a top wall of the process chamber 101, electrically connected to the controller 110, configured to obtain the temperature of the wafer in the process chamber 101 through the dielectric window 105, and send the temperature to the controller 110. For example, the non-contact temperature measurement element can include a thermometer 109 and a temperature measurement probe 108 arranged outside of the process chamber 101. The thermometer 109 can be electrically connected to the controller 110. The temperature measurement probe 108 can be electrically connected to the thermometer 109. The temperature measurement probe 108 can be configured to obtain the temperature of the wafer in the process chamber 101 through the dielectric window 105 located at the top wall of the process chamber 101. The thermometer 109 can be configured to calculate a temperature change rate of the wafer 104 according to the temperature obtained by the temperature measurement probe 108.

In some other embodiments, the temperature monitor unit can also be implemented by using another type of temperature measurement sensor. The temperature measurement probe 108 can also be arranged inside the process chamber. Those skilled in the art can select according to actual conditions.

The controller 110 can be configured to calculate the temperature change rate of the wafer 104 according to the temperature obtained by the temperature monitor unit. If the temperature change rate is outside a predetermined temperature change rate range, a first control signal can be sent to the gas inflation mechanism and/or a second control signal can be sent to the gas extraction mechanism to control the temperature change rate within the temperature change rate range.

The gas inflation mechanism can be communicated with the process chamber 101 and configured to introduce a gas that does not react with the wafer 104 into the process chamber 101 according to the received first control signal to control the temperature change rate of the wafer 104 by adjusting the pressure of the process chamber 101. The gas that does not react with the wafer 104 can include, for example, an inert gas such as argon or nitrogen.

In some embodiments, the gas inflation mechanism can include a gas inflation pipeline communicated with the process chamber 101. The gas inflation pipeline can be provided with a gas inflation valve 106. The gas inflation valve 106 can be electrically connected to the controller 110. The controller 110 can be configured to send the first control signal to the gas inflation valve 106. The gas inflation valve 106 can be turned on or off according to the first control signal to connect or disconnect the gas inflation pipeline.

The gas extraction mechanism can be communicated with the process chamber 101 and configured to extract the gas of the process chamber 101 according to the received second control signal to control the temperature change rate of the wafer 104 by adjusting the pressure of the process chamber 101.

In some embodiments, the gas extraction mechanism can include a gas extraction pipeline communicated with the process chamber 101. A gas extraction valve 107 can be arranged at the gas extraction pipeline. The gas extraction valve 107 can be electrically connected to the controller 110. The controller 110 can be configured to send the second control signal to the gas extraction valve 107. The gas extraction valve 107 can be configured to be turned on or off according to the second control signal to connect or disconnect the gas extraction pipeline.

The controller 110 of embodiments of the present disclosure can include a microprocessor such as PLC or PC. The calculation of the temperature change rate of the wafer can be performed by the thermometer 109 or by the controller 110. The controller 110 can be configured to send the first control signal to the gas inflation mechanism and/or the second control signal to the gas extraction mechanism. The gas inflation mechanism can be configured to introduce the gas that does not react with the wafer into the process chamber according to the received first control signal. The gas extraction mechanism can be configured to extract the gas of the process chamber according to the received second control signal. Thus, the pressure of the process chamber 101 can be adjusted to indirectly adjust the heat transfer between the wafer and a heat source or a cold source to control the temperature change rate of the wafer until the temperature change rate is within the temperature change rate range. Thus, the temperature change rate of the wafer can be accurately controlled, the temperature adjustment efficiency of the process chamber 101 can be effectively improved, and the particle contamination problem due to the wafer being cooled too fast can be avoided.

Figure 3:
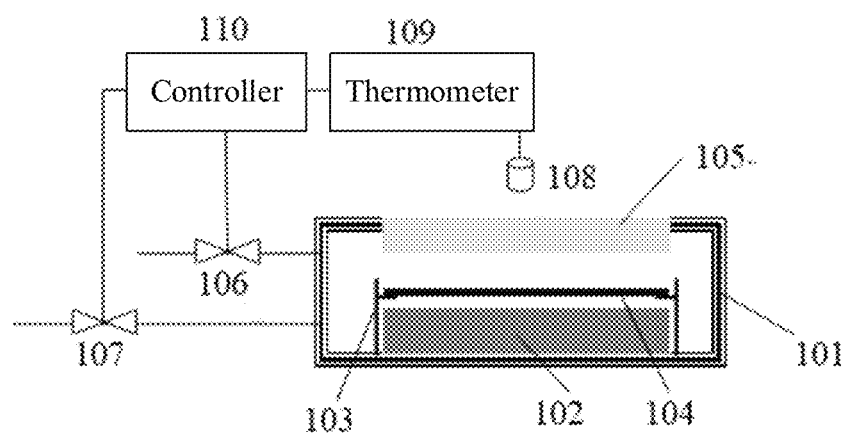
FIG. 3 illustrates a schematic structural diagram of a semiconductor process apparatus according to some embodiments of the present disclosure.

FIG. 3 illustrates a schematic structural diagram of a semiconductor process apparatus according to some embodiments of the present disclosure. As shown in FIG. 3, embodiments of the present disclosure provide a semiconductor process apparatus, including a process chamber 101 and the temperature change rate control device above.

In some embodiments, the process chamber 101 can be provided with a bracket 103 and a cold plate 102. The bracket 103 can be configured to support the wafer 104 above the cold plate 102 and cause a gap between the wafer 104 and the cold plate 102. The process chamber 101 can be provided with a dielectric window 105. A temperature measurement probe 108 can be arranged at a position corresponding to the dielectric window 105 to obtain the temperature of the wafer 104 in the process chamber 101 through the dielectric window 105.

In a specific implementation process, when the wafer 104 needs to be cooled, a cooling liquid can be introduced into the cold plate 102. The heat of the wafer 104 can be indirectly taken away by the circulation of the cooling liquid. The process chamber 101 can be filled with a gas that does not react with the wafer 104, e.g., an inert gas such as argon. Thus, the wafer 104 (e.g., a wafer) can be mainly cooled by heat transfer between the inert gas and the cold plate 102. When the pressure of the inert gas in the process chamber 101 is higher, the heat transfer between the inert gas and the cold plate 102 can be faster, and the cooling rate of the wafer can be larger, and vice versa. Therefore, by adjusting the pressure in the process chamber 101 through the temperature change rate control device, the heat transfer between the wafer 104 and the cold plate 102 can be indirectly adjusted. Thus, the temperature change rate of the wafer 104 can be controlled within a predetermined temperature change rate range to further realize the precise control of the temperature change rate of the wafer 104 and avoid the problem of particle contamination due to the cooling of the wafer 104 being too fast.

In other embodiments, the temperature change rate control device of the present disclosure can also be applied in a heating process of another type of the process chamber 101. For example, the wafer 104 in the process chamber 101 can be heated by a heating base or heating chamber wall, and the pressure in the process chamber can be adjusted by the temperature change rate control device to indirectly adjust the heat transfer between to wafer process chamber 101 through the temperature change rate control device, thereby indirectly and the heat source, until the temperature rising rate of the wafer adjusting the heat transfer between is within a predetermined temperature rising rate range. Thus, the temperature rising rate of the wafer 104 can be accurately controlled.

Figure 4:
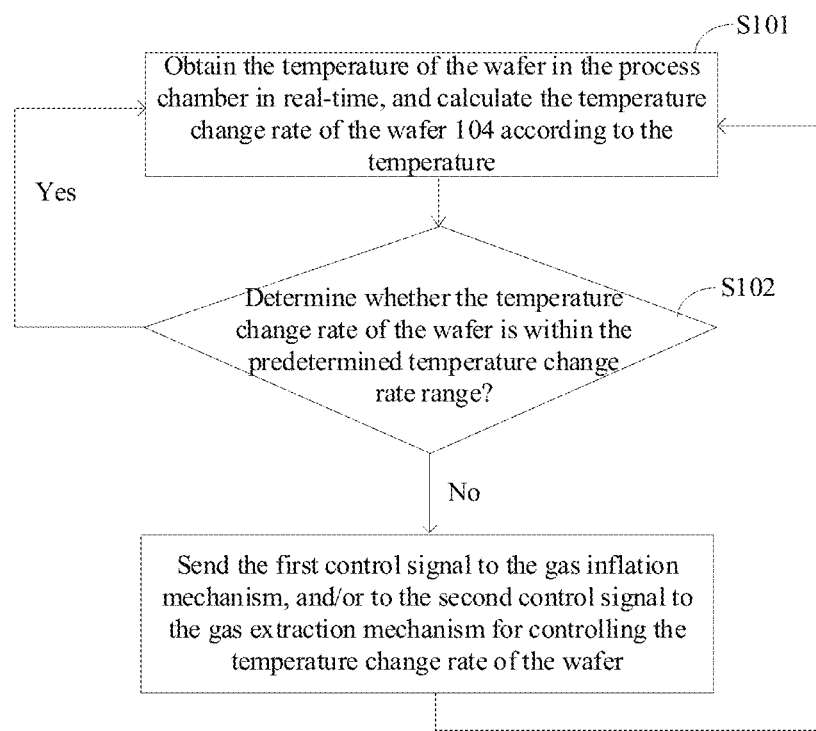
FIG. 4 illustrates a schematic flow block diagram of a temperature change rate control method according to some embodiments of the present disclosure.

FIG. 4 illustrates a schematic flow block diagram of a temperature change rate control method according to some embodiments of the present disclosure. As shown in FIG. 4, embodiments of the present disclosure provide a temperature change rate control method, which is applied to a process chamber of a semiconductor process apparatus. In the temperature change rate control method, the temperature change rate control device above can be used. The method includes the following processes.

At S101, the temperature of the wafer 104 in the process chamber 101 is obtained in real-time, and the temperature change rate of the wafer 104 is calculated according to the temperature.

In some embodiments, a temperature at a predetermined position of the wafer can be collected by the temperature measurement probe 108 and the thermometer 109 per unit time. The controller 110 can be configured to calculate a change value of the wafer temperature per second according to the temperature obtained by the thermometer 109 to determine the temperature change rate of the wafer. The predetermined position can include at least one predetermined temperature measurement point or predetermined temperature measurement area on the wafer. When the predetermined temperature measurement point has only one temperature measurement point, only one temperature measurement point needs to be monitored to determine the temperature change rate of the wafer. When the predetermined position includes a plurality of predetermined temperature measurement points or predetermined temperature measurement areas, the temperature decrease rate can be a change value per second of an average temperature in the plurality of predetermined temperature measurement points or predetermined temperature measurement areas. To ensure to obtain the accurate temperature change rate, in some embodiments, the change value of the average temperature of the plurality of temperature measurement points can be simultaneously monitored as the temperature change rate of the whole wafer.

At S102, whether the temperature change rate of the wafer 104 is within the predetermined temperature change rate range is determined, if the temperature change rate of the wafer is not within the predetermined temperature change rate range, then the first control signal is sent to the gas inflation mechanism, and/or to the second control signal is sent to the gas extraction mechanism for controlling the temperature change rate of the wafer.

The gas inflation mechanism can introduce the gas that does not react with the wafer 104 into the process chamber 101 according to the received first control signal to control the temperature change rate of the wafer 104 by adjusting the pressure of the process chamber 101. The extraction mechanism can extract the gas in the process chamber 101 according to the received second control signal to control the temperature change rate of the wafer 104 by adjusting the pressure of the process chamber 101.

Then, the process can return to above step S101.

If the temperature change rate of the wafer 104 is within the predetermined temperature change rate range, the process can return to step S101.

Figure 5:
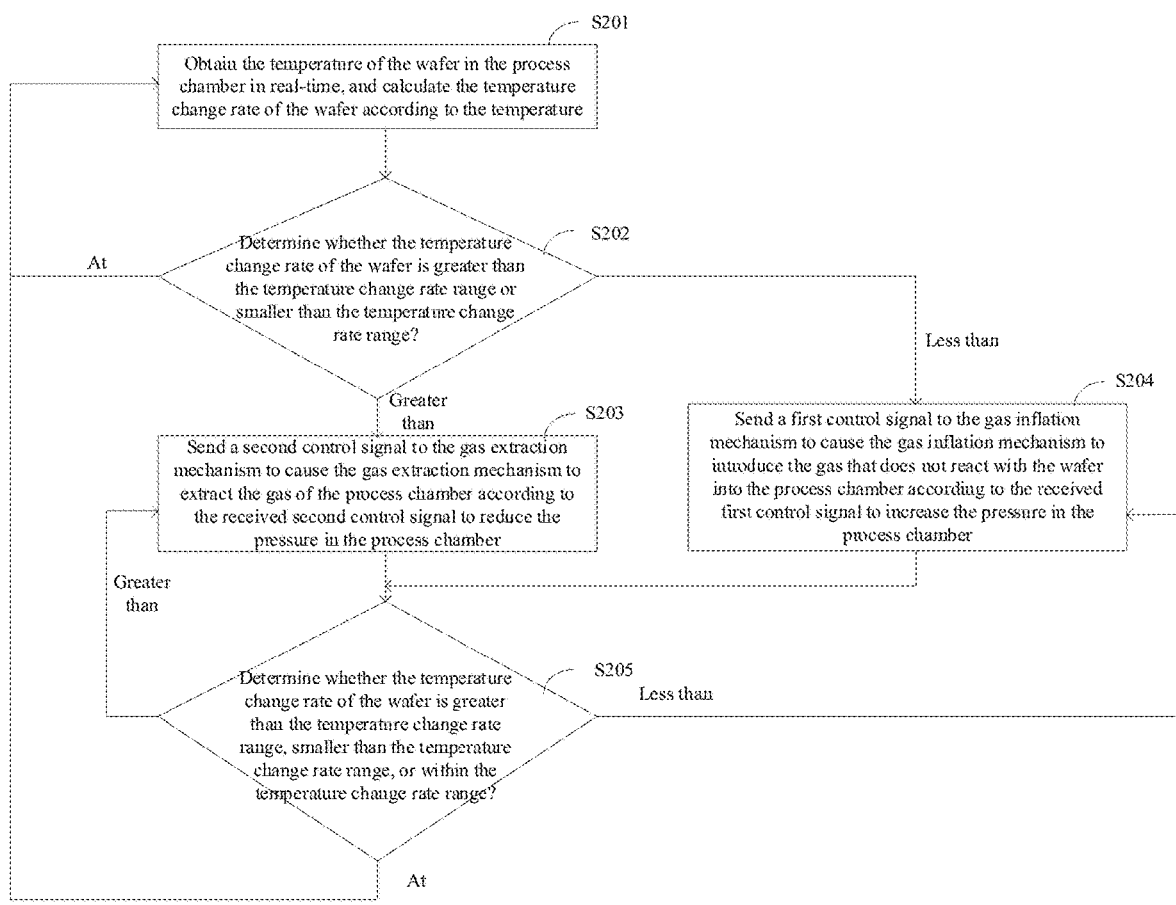
FIG. 5 illustrates another schematic flow block diagram of a temperature change rate control method according to some embodiments of the present disclosure.

In some embodiments, as shown in FIG. 5, the temperature change rate control method includes the following processes.

At S201, the temperature of the wafer 104 in the process chamber 101 is obtained in real-time, and the temperature change rate of the wafer 104 is calculated according to the temperature.

At S202, whether the temperature change rate of the wafer 104 is greater than the temperature change rate range or smaller than the temperature change rate range is determined.

If the temperature change rate of the wafer 104 is greater than the temperature change rate range, the method then proceeds to step S203. If the temperature change rate of the wafer 104 is less than the temperature change rate range, the method then proceeds to step S204. If the temperature change rate of the wafer 104 is within the temperature change rate range, the method then returns to step S201.

At S203, a second control signal is sent to the gas extraction mechanism to cause the gas extraction mechanism to extract the gas of the process chamber 101 according to the received second control signal to reduce the pressure in the process chamber 101, and the method then proceeds to step S205.

At S204, a first control signal is sent to the gas inflation mechanism to cause the gas inflation mechanism to introduce the gas that does not react with the wafer 104 into the process chamber 101 according to the received first control signal to increase the pressure in the process chamber 101, and the method then proceeds to step S205.

At S205, whether the temperature change rate of the wafer 104 is greater than the temperature change rate range, smaller than the temperature change rate range, or within the temperature change rate range is determined. If the temperature change rate of the wafer 104 is greater than the temperature change rate range, the method proceeds to step S203. If the temperature change rate of the wafer 104 is less than the temperature change rate range, the method proceeds to step S204. If the temperature change rate of the wafer 104 is within the temperature change rate range, the method returns to step S201.

In some embodiments, the temperature change rate can range from 4° C./s to 6° C./s. In some embodiments, the temperature change rate can be 5° C./s.

Taking the temperature change rate control device shown in FIG. 2 as an example, the gas inflation mechanism includes the gas inflation pipeline communicated with the process chamber 101. The gas inflation valve 106 is arranged at the inflation pipeline. The gas inflation valve 106 is electrically connected to a controller 110. The controller 110 can be configured to send the first control signal to the gas inflation valve 106. The inflation valve 106 can be configured to be turned on or off according to the first control signal to connect or disconnect the gas inflation pipeline. The gas extraction mechanism includes the gas extraction pipeline communicated with the process chamber 101. The gas extraction valve 107 is arranged at the gas extraction pipeline. The gas extraction valve 107 can be electrically connected to the controller 110. The controller 110 can be configured to send the second control signal to the gas extraction valve 107. The gas extraction valve 107 can be configured to be turned on or off to connect or disconnect the gas extraction pipeline.

In some embodiments, sending the second control signal to the gas extraction mechanism to cause the gas extraction mechanism to extract the gas of the process chamber according to the received second control signal includes controlling the gas extraction valve 107 to be turned on for a first predetermined time length and then be turned off.

In some embodiments, the first predetermined time length can range from 0.2 s to 1 s. In some embodiments, the first predetermined time length can be 0.5 s.

In some embodiments, sending the first control signal to the gas inflation mechanism to cause the gas inflation mechanism to introduce the gas that does not react with the wafer into the process chamber according to the received first control signal includes controlling the gas inflation vale 106 to be turned on for a second predetermined time length and then turned off.

In some embodiments, the second predetermined time length can range from 0.2 s to 1 s. In some embodiments, the second predetermined time length can be 0.5 s.

In the specific implementation process, the pressure of the inert gas in the chamber can be adjusted in real-time according to the actual temperature of the wafer to obtain the required cooling rate. Thus, the process result can be ensured to be qualified, e.g., particle performance and the impact on the productivity of the machine can be reduced as much as possible to reduce the occupation of the process chamber 101 by the wafer and increase the efficiency.

In some other embodiments, when the temperature change rate control device of the present disclosure is applied in a heating process of another type of process chamber, the temperature change rate control method of the present disclosure can be used to adjust the pressure of the process chamber by the temperature change rate control device to indirectly adjust the heat transfer between the wafer and the heat source until the temperature rising rate of the wafer is in the predetermined temperature rising rate range to accurately control the wafer temperature rising rate.

In summary, in the technical solution of the temperature change rate control device, method, and semiconductor process apparatus of the present disclosure, the temperature of the wafer located in the process chamber can be obtained in real-time through the temperature monitor unit. The temperature change rate of the wafer can be calculated by the controller. If the temperature change rate is outside the predetermined temperature change rate range, the first control signal can be sent to the gas inflation mechanism, and/or the second control signal can be sent to the gas extraction mechanism. The gas inflation mechanism can be configured to introduce the gas that does not react with the wafer into the process chamber according to the received first control signal. The gas extraction mechanism can be configured to extract the gas from the process chamber according to the received second control signal. Thus, the pressure of the process chamber can be adjusted to indirectly adjust the heat transfer between the wafer and the heat source or the cold source to control the temperature change rate of the wafer until the temperature change rate is in the temperature change rate range. Thus, the temperature change rate of the wafer can be accurately controlled, and the temperature adjustment efficiency of the process chamber can be effectively improved. Meanwhile, the problem of particle contamination due to the wafer being cooled too fast can be avoided.

Embodiments of the present disclosure are described above. The above description is exemplary, not exhaustive and is not limited to the disclosed embodiments. Many modifications and changes can be apparent to those of ordinary skill in the art without departing from the scope and spirit of embodiments of the present disclosure.

What is claimed is:

1. A temperature change rate control device, applied to a process chamber of a semiconductor process apparatus, comprising:
    a temperature monitor unit configured to obtain a temperature of a to-be-processed piece in the process chamber in real time;
    a controller connected to the temperature monitor unit and configured to calculate a temperature change rate of the to-be-processed piece according to the temperature obtained by the temperature monitor unit;
    a gas inflation mechanism connected to the controller and communicated with the process chamber; and
    a gas extraction mechanism connected to the controller and communicated with the process chamber;
    wherein:
        in response to the temperature change rate being outside a predetermined temperature change rate range, a first control signal is sent to the gas inflation mechanism, and/or a second control signal is sent to the gas extraction mechanism until the temperature change rate is within the temperature change rate range;
        the gas inflation mechanism is configured to introduce a gas that does not react with the to-be-processed piece into the process chamber according to the received first control signal to control the temperature change rate of the to-be-processed piece by adjusting a pressure of the process chamber; and
        the gas extraction mechanism is configured to extract the gas of the process chamber according to the received second control signal to control the temperature change rate of the to-be-processed by adjusting the pressure of the process chamber.

2. The temperature change rate control device according to claim 1, wherein the temperature monitoring unit includes:
    a temperature measurement device and a temperature measurement probe arranged outside the process chamber, the temperature measurement device being electrically connected to the controller, the temperature measurement probe being electrically connected to the temperature measurement device, the temperature measurement probe being configured to obtain the temperature of the to-be-processed piece in the process chamber through a dielectric window on a top wall of the process chamber, and the temperature measurement device being configured to calculate the temperature change rate of the to-be-processed piece according to the temperature obtained by the temperature measurement probe.

3. The temperature change rate control device according to claim 1, wherein the gas inflation mechanism includes:

a gas inflation pipeline communicated with the process chamber; and a gas inflation valve arranged at the inflation pipeline and electrically connected to the controller, the controller being configured to send the first control signal to the gas inflation valve, and the gas inflation valve being configured to be turned on or off according to the first control signal.

4. The temperature change rate control device according to claim 1, wherein the gas extraction mechanism includes:

a gas extraction pipeline communicated with the process chamber; and a gas extraction valve arranged at the gas extraction pipeline, and electrically connected to the controller, the controller being configured to send the second control signal to the gas extraction valve, and the gas extraction valve being configured to be turned on or off according to the received second control signal.

5. A semiconductor process apparatus comprising:

a process chamber; and a temperature change rate control device, including:
    a temperature monitor unit configured to obtain a temperature of a to-be-processed piece in the process chamber in real time;
    a controller connected to the temperature monitor unit and configured to calculate a temperature change rate of the to-be-processed piece according to the temperature obtained by the temperature monitor unit;
    a gas inflation mechanism connected to the controller and communicated with the process chamber; and
    a gas extraction mechanism connected to the controller and communicated with the process chamber;
    wherein:
        in response to the temperature change rate being outside a predetermined temperature change rate range, a first control signal is sent to the gas inflation mechanism, and/or a second control signal is sent to the gas extraction mechanism to control the temperature change rate within the temperature change rate range;
        the gas inflation mechanism is configured to introduce a gas that does not react with the to-be-processed piece into the process chamber according to the received first control signal to control the temperature change rate of the to-be-processed piece by adjusting a pressure of the process chamber; and
        the gas extraction mechanism is configured to extract the gas of the process chamber according to the received second control signal to control the temperature change rate of the to-be-processed piece by adjusting the pressure of the process chamber.

6. The semiconductor process apparatus according to claim 5, wherein the process chamber includes:

a cold plate; and a bracket arranged at a bottom of the process chamber and configured to support the to-be-processed piece above the cold plate and cause a gap between the to-be-processed piece and the cold plate.

7. The semiconductor process apparatus according to claim 5, wherein:

the process chamber further includes:
    a dielectric window arranged at a top wall of the process chamber; and
    a temperature measurement probe is located at a position corresponding to the dielectric window, and configured to obtain the temperature of the to-be-processed piece in the process chamber through the dielectric window.

8. A temperature change rate control method, applied to a semiconductor process apparatus, comprising:

obtaining a temperature of a to-be-processed piece in the process chamber in real time;

calculating a temperature change rate of the to-be-processed piece according to the temperature; and determining whether the temperature change rate of the to-be-processed piece is within a predetermined temperature change rate range:
    in response to the temperature change rate of the to-be-processed piece being not within the predetermined temperature change rate range:
        controlling a gas inflation mechanism to introduce a gas that does not react with the to-be-processed piece into the process chamber or a gas extraction mechanism to extract the gas to control the temperature change rate of the to-be-processed piece by adjusting a pressure of the process chamber until the temperature change rate is within the temperature change rate range.

9. The temperature change rate control method according to claim 8, wherein controlling the gas inflation mechanism to introduce the gas that does not react with the to-be-processed piece into the process chamber or the gas extraction mechanism to extract the gas to control the temperature change rate of the to-be-processed piece by adjusting the pressure of the process chamber until the temperature change rate is within the temperature change rate range includes:

in response to the temperature change rate of the to-be-processed piece being greater than the temperature change rate range, controlling the gas extraction valve to open for a first predetermined time length and then close to reduce the pressure in the process chamber and obtaining the temperate adjustment rate of the to-be-processed piece again; and determining whether the temperature change rate of the to-be-processed piece is within the determined temperature change rate range:
    if the temperature change rate of the to-be-processed piece is within the temperature change rate range, continuing to obtain the temperature of the to-be-processed piece in the process chamber in real-time and calculating the temperature adjustment rate of the to-be-processed piece according to the temperature; and
    if the temperature rate is still greater than the temperature change rate range, continuing to control the gas extraction valve to open for the first predetermined time length and then close until the temperature adjustment rate is within the temperature adjustment rate range.

10. The temperature change rate control method according to claim 9, wherein controlling the gas inflation mechanism to introduce the gas that does not react with the to-be-processed piece into the process chamber or the gas extraction mechanism to extract the gas to control the temperature change rate of the to-be-processed piece by adjusting the pressure of the process chamber until the temperature change rate is within the temperature change rate range further includes:

if the temperature adjustment rate of the to-be-processed piece is smaller than the temperature adjustment rate range, controlling the gas inflation value to open for a second predetermined time length and then close to increase the pressure in the process chamber, and obtaining the temperature adjustment rate of the to-be-processed piece again; and determining whether the temperature change rate of the to-be-processed piece is within the determined temperature change rate range:

if the temperature change rate of the to-be-processed piece is within the temperature change rate range, continuing to obtain the temperature of the to-be-processed piece in the process chamber in real-time and calculating the temperature adjustment rate of the to-be-processed piece according to the temperature; and if the temperature rate is still smaller than the temperature change rate range, continuing to control the gas inflation valve to open for the second predetermined time length and then close until the temperature adjustment rate is within the temperature adjustment rate range.

* * * * *